(12) United States Patent
Chien et al.

(10) Patent No.: US 6,171,882 B1
(45) Date of Patent: Jan. 9, 2001

(54) METHOD OF MANUFACTURING PHOTO DIODE

(75) Inventors: Cheng-Hung Chien, Taipei Hsien; Jen-Yao Hsu, Hsinchu Hsien; Jui-Hsiang Pan, Hsinchu, all of (TW)

(73) Assignee: United Microelectronics Corp. (TW)

( * ) Notice: Under 35 U.S.C. 154(b), the term of this patent shall be extended for 0 days.

(21) Appl. No.: 09/210,526

(22) Filed: Dec. 11, 1998

(51) Int. Cl.⁷ .................................................. H01L 21/00
(52) U.S. Cl. ............................................................ 438/57
(58) Field of Search ............................... 438/57, 60, 73, 438/75, 144, 723, 724, 759, 762, 763

(56) References Cited

U.S. PATENT DOCUMENTS 5,215,928 * 6/1993 Hirai ........................................ 438/59

FOREIGN PATENT DOCUMENTS

03094478 * 4/1991 (JP) .

OTHER PUBLICATIONS

Ghandhi, Sorab; The Theory and Practice of Microelectronics; John Wiley and Sons, pp. 180–184 (no month available), 1968.*

* cited by examiner

Primary Examiner—Charles Bowers
Assistant Examiner—Keith Christianson
(74) Attorney, Agent, or Firm—Blakely Sokoloff Taylor & Zafman

(57) ABSTRACT

A structure of a photo diode and a method of manufacturing a photo diode comprise the steps of providing a substrate having an isolation region and a device region. A doped region is formed adjacent to the isolation region in the substrate by performing an ion implantation step and an annealing step. Next, a protective layer utilized to prevent the plasma damage is formed on the substrate and the isolation region, and an inter-layer dielectric layer is formed on the protective layer. Thereafter, a contact hole is formed to expose a portion of the doped region by patterning the inter-layer dielectric layer and the protective layer, and a contact plug is formed by filling the contact hole with a conductive material.

13 Claims, 4 Drawing Sheets

METHOD OF MANUFACTURING PHOTO DIODE

BACKGROUND OF THE INVENTION

1. Field of the Invention

The present invention relates to a method of manufacturing a semiconductor device. More particularly, the present invention relates to a method of manufacturing a photo diode.

2. Description of the Related Art

A photo diode based on the theorem of a P-N junction can convert light into an electrical signal. Before light energy in the form of photons strikes the photo diode, there is a depletion layer in the P-N junction and the depletion layer works as an electric field of the capacitor. The electrons in N region do not diffuse to the P region and the holes in the P region do not diffuse to the N region. When enough light strikes the photo diode, the light creates a number of electron-hole pairs. The electrons and the holes diffuse to the P-N junction. As the electrons and the holes reach the P-N junction, the electrons flow to the N region and the holes flow to the P region as a result of the effect of the inner electric field. Thus a current is induced between the P-N junction electrodes. Ideally, a photo diode in the dark is open-circuit. In other words there is no current induced by light energy while the photo diode is in the dark.

Photo diodes are utilized to produce imaging sensors which include charge-coupled device cameras (CCD cameras), PC digital cameras etc. Conventionally, the photo diode usually suffers from plasma damage. Plasma damage is caused by later process steps that include forming an inter-layer dielectric, opening a contact hole, forming a conductive layer, etc. Due to plasma damage, the dark current is uneven, the pixels of the imaging sensors leak irregularly and spots of light occur in the display image.

FIGS. 1A through 1D are schematic, cross-sectional views of a portion of a semiconductor device showing a conventional photo diode.

First, as shown in FIG. 1A, a substrate 100 having a first conductive type is provided. A patterned mask layer 102 is formed on the substrate 100. Thereafter, a LOCOS step is performed to form a field oxide 104 utilized as an isolation region on the substrate 100 exposed by the mask 102.

Referring to FIG. 1B, the mask layer 102 is stripped to expose the surface of the substrate 100 and the isolation region 104. Thereafter, an ion implantation step and an annealing step are utilized to form a doped region 110 having a second conductive type in the active area of the substrate 100 exposed by the isolation region 104.

Next, as shown in FIG. 1C, an inter-layer dielectric layer 112 having a contact hole 116 is formed on the substrate 100 and the isolation region 104, and the contact hole 116 exposes a portion of the active area of the substrate 100. Thereafter, a conductive layer 114 is formed over the substrate 100 and fills the contact hole 116 to form a contact plug 114.

Next, as shown in FIG. 1D, the conductive layer 114 is patterned to form a conductive layer 114a.

Conventionally, plasma damage is caused in the processes of forming the inter-layer dielectric layer, opening the contact hole, forming the conductive layer, etc. Furthermore, the plasma damage leads to uneven dark current, irregular pixel leakage of the imaging sensor, and the spots of light which occur on the display image.

In light of the foregoing, there is a need to provide an improved structure of a photo diode and a method of manufacturing an improved photo diode.

SUMMARY OF THE INVENTION

Accordingly, the present invention is to provide a structure of a photo diode and a method of manufacturing a photo diode. A protective layer can prevent the plasma damage, therefore the weaknesses seen in the prior art such as uneven dark current and irregular pixel leakage of the imaging sensor induced by the plasma damage can be overcome.

To achieve these and other advantages and in accordance with the purpose of the invention, as embodied and broadly described herein, the invention provides a method of manufacturing a photo diode. The method comprises the step of providing a substrate having an isolation region. A doped region is formed in the substrate by performing an ion implantation step and an annealing step. Next, a protective layer utilized to prevent the plasma damage is formed on the substrate and the isolation region and an inter-layer dielectric layer is formed on the protective layer. Thereafter, a contact hole is formed to expose a portion of the doped region by patterning the inter-layer dielectric layer and the protective layer, and a contact plug is formed by filling the contact hole with a conductive material.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
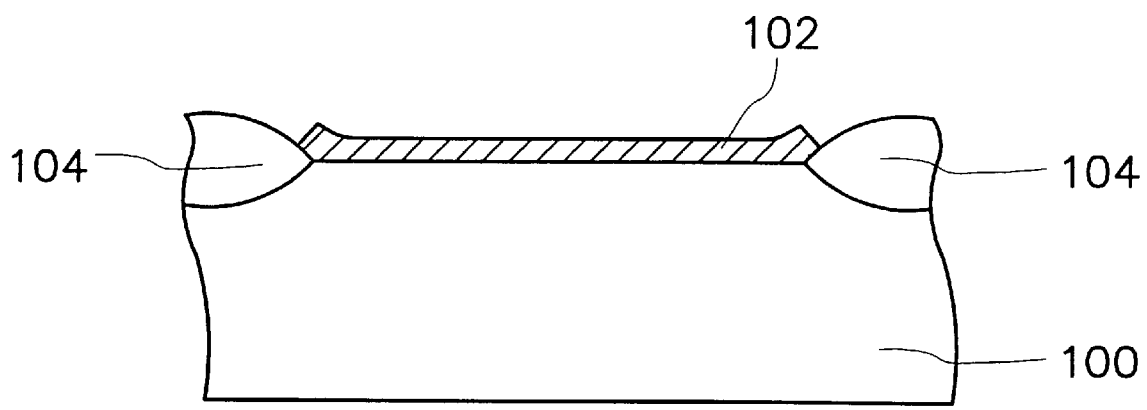
FIGS. 1A through 1D are schematic, cross-sectional views of the conventional process for manufacturing a photo diode.
Figure 1B:
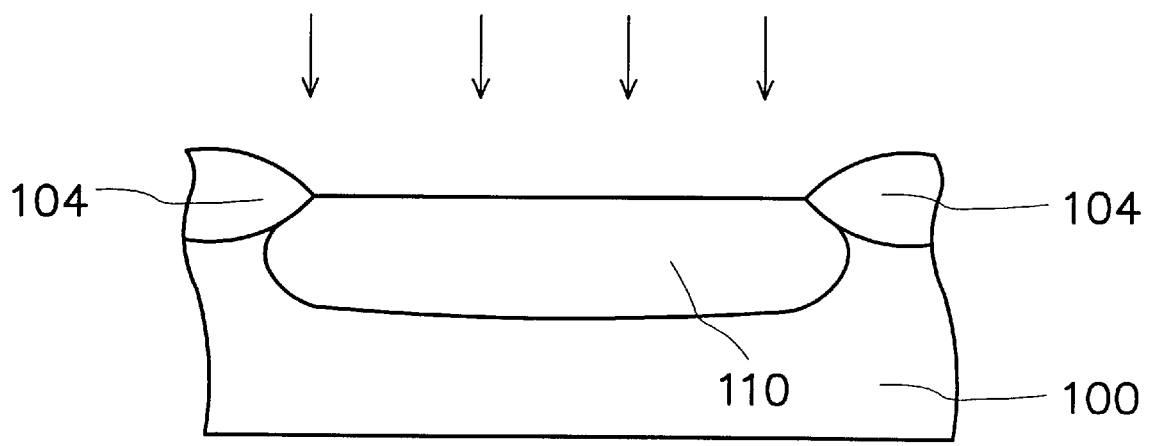
Figure 1C:
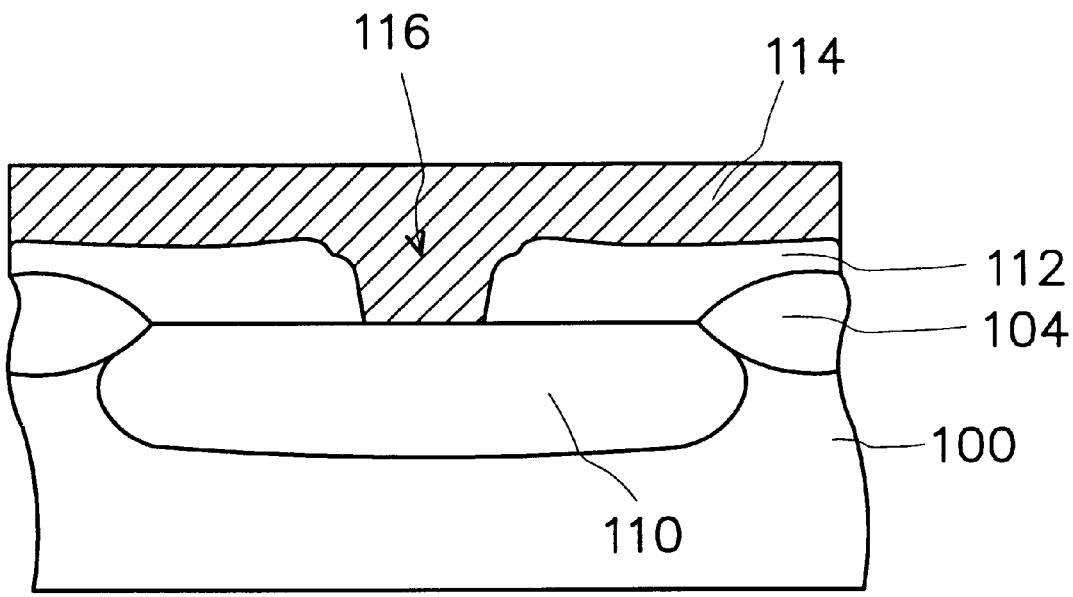
Figure 1D:
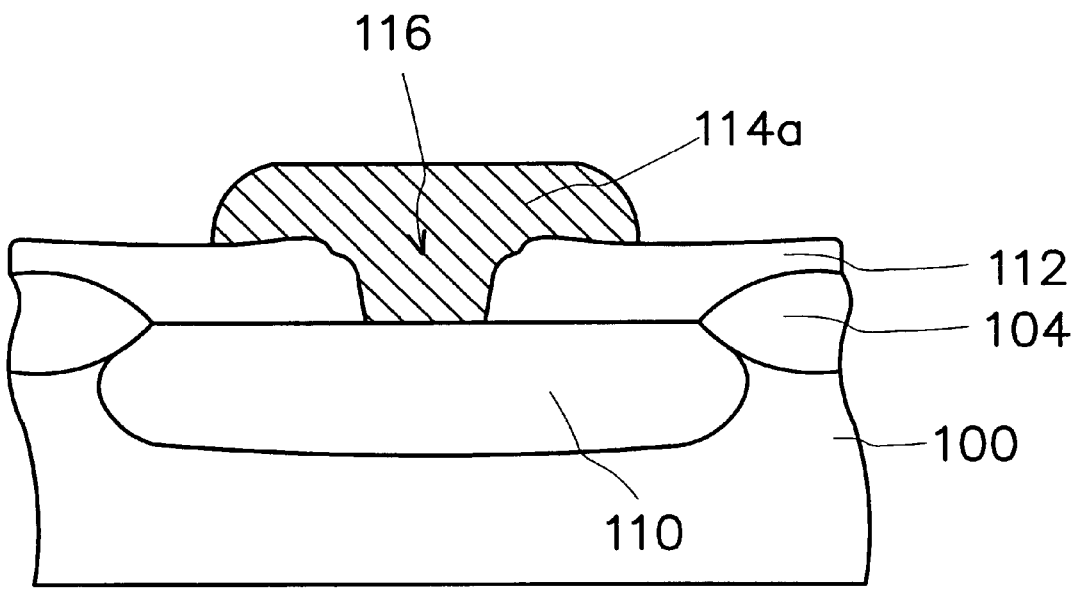

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic, cross-sectional views of the process for manufacturing a photo diode in a preferred embodiment according to the invention.

Figure 2A:
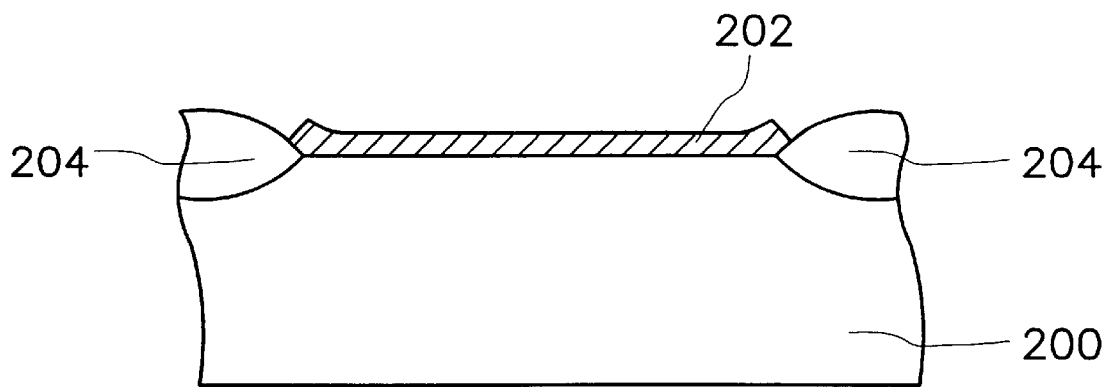
FIGS. 2A through 2E are schematic, cross-sectional views of the process for manufacturing a photo diode in a preferred embodiment according to the invention.

First, as shown in FIG. 2A, a substrate 200 having a first conductive type is provided. A patterned mask layer 202 such as a silicon nitride layer is formed on the substrate 200. Thereafter, a LOCOS step is performed to form a field oxide 204 on the substrate 200 exposed by the mask 202. The field oxide 204 serves as an isolation region.

Figure 2B:
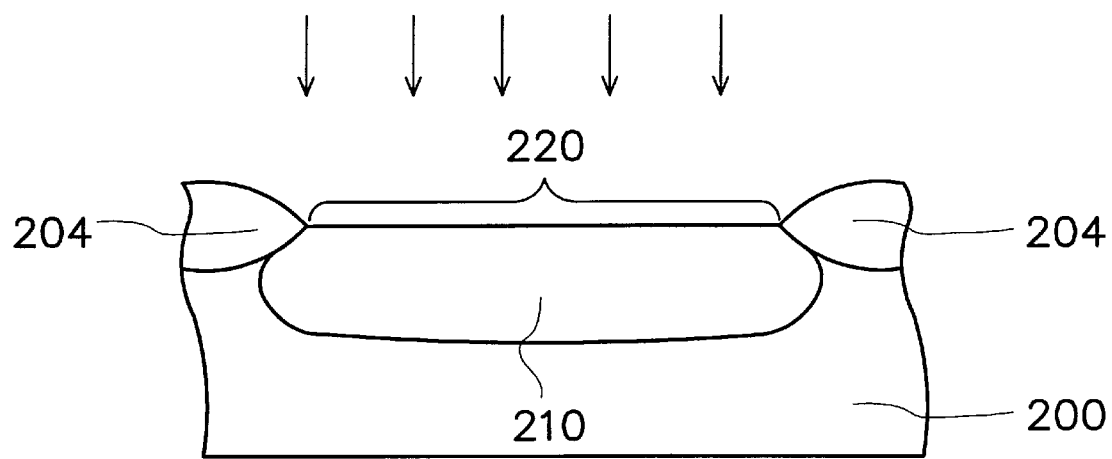

Referring to FIG. 2B, the mask layer 202 is stripped to expose the surface of the substrate 200 covered by the mask layer 202. The isolation region 204 is also exposed. The method of stripping the mask layer 202 can be a dry etching step, for example. Thereafter, an ion implantation step and an annealing step are utilized to form a doped region 210 in the active area 220 of the substrate 200 exposed by the isolation region 204. The doped region has a second conductive type. The dopant type of the second conductive type and that of the first conductive type are different.

Figure 2C:
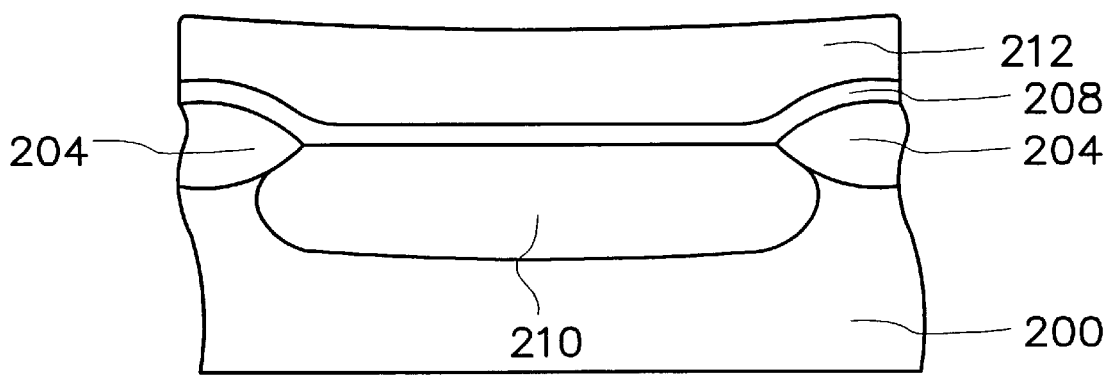

Next, as shown in FIG. 2C, a protective layer 208 is formed on the substrate 200 and the isolation region 204. Preferably, thickness of the protective layer 208 is more than 100 Å. The protective layer 208 can be a silicon nitride layer or other suitable protective layer, for example. The utility of the protective layer 208 is to prevent the plasma damage caused by later process steps that include forming an inter-layer dielectric, opening a contact via, sputtering metals, etc. Next, an inter-layer dielectric layer 212 is formed on the protective layer 208. The inter-layer dielectric layer 212 can be a borophosphotetraethosiloxane(BPTEOS) layer or a borophosphosilicate glass(BPSG) layer. The method of forming the inter-layer dielectric layer 212 includes chemical vapor deposition, and the preferred method is plasma enhanced chemical vapor deposition or atmosphere pressure chemical vapor deposition. Preferably, the plasma enhanced chemical vapor deposition step is carried out at a temperature of about 300–400 degrees centigrade and a pressure of about 0.1–5 torr.

Figure 2D:
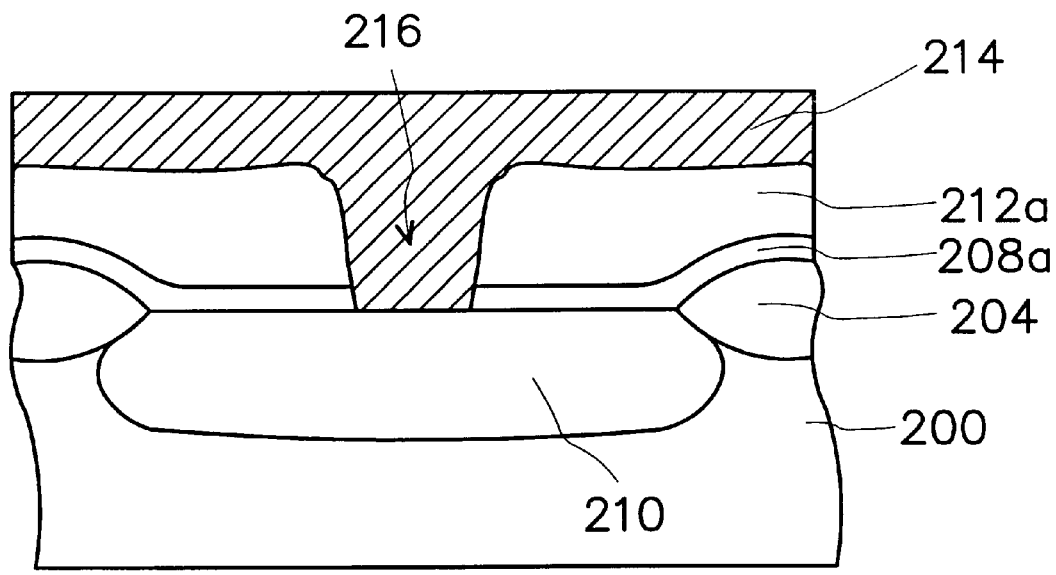

Referring to FIG. 2D, a contact hole 216 is formed by patterning the inter-layer dielectric layer 212 and the protective layer 208. The contact hole 216 exposes a portion of the active area. Thus, the inter-layer dielectric layer 212 and the protective layer 208 are converted into an inter-layer dielectric layer 212a and a protective layer 208a. The method of forming the contact hole 216 can be a dry etching step, for example. Thereafter, a conductive layer 214 is formed over the substrate 200 and fills the contact hole 216 to form a contact plug 214.

Figure 2E:
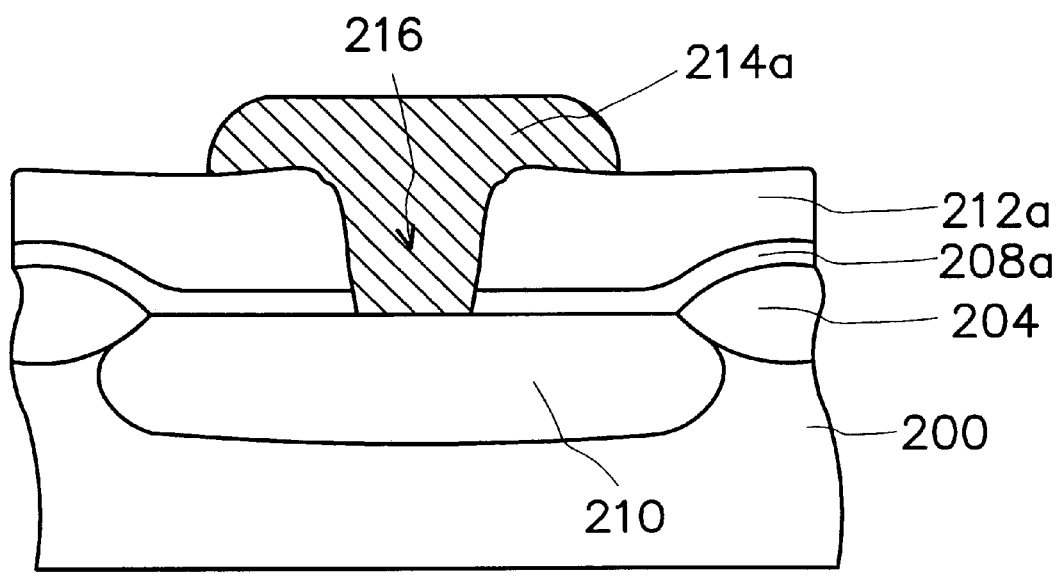

Next, as shown in FIG. 2E, the conductive layer 214 is patterned to form a conductive layer 214a.

In the preferred embodiment according to the present invention, a protective layer 208 is formed on the substrate 200 and the isolation region 204 before the inter-layer dielectric layer 212 is formed over the substrate 200. Since the protective layer 208 can prevent the plasma damage induced by later process steps, the problems caused by the plasma damage, such as uneven dark current, irregular pixel leakage of the imaging sensors and spots of light which occur on the display image, can be overcome.

The present invention has the following advantages:

1. In the present invention, the protective layer is formed on the substrate and the isolation region after the performance of the ion implantation step, and then, the inter-layer dielectric layer is formed over the substrate. Since the protective layer can prevent the plasma damage induced by later process steps, the problems caused by the plasma damage, such as uneven dark current, irregular pixel leakage of the imaging sensors and spots of light which occur on the display image, can be overcome.

2. The present invention and the conventional process techniques are compatible; thus, the present invention is suitable for manufacturers to utilize.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a photo diode, comprising the steps of:

providing a substrate having a first conductive type;

forming an isolation region on a portion of the substrate;

forming a doped region having a second conductive type adjacent to the isolation region in the substrate;

forming a protective layer on the substrate and the isolation region;

forming an inter-layer dielectric layer on the protective layer;

forming a contact hole through the inter-layer dielectric layer and the protective layer to expose a portion of the doped region; and forming a contact plug after forming the protective layer by filling the contact hole with a conductive material.

2. The method of claim 1, wherein the protective layer includes a silicon nitride layer.

3. The method of claim 1, wherein the step of forming the isolation region includes the LOCOS.

4. The method of claim 1, wherein the isolation region includes field oxide.

5. The method of claim 1, wherein the dopant type of the first conductive type and that of the second conductive type are different.

6. The method of claim 1, wherein the thickness of the protective layer is more than 100 Å.

7. The method of claim 1, wherein the inter-layer dielectric layer includes borophosphotetraethosiloxane.

8. The method of claim 1, wherein the inter-layer dielectric layer includes borophosphosilicate glass.

9. The method of claim 1, wherein the step of forming the inter-layer dielectric layer includes plasma enhanced chemical vapor deposition.

10. The method of claim 1, wherein the step of forming the inter-layer dielectric layer includes atmosphere pressure chemical vapor deposition.

11. The method of claim 1, wherein the step of forming the contact hole includes dry etching.

12. The method of claim 1, wherein the step of forming the contact plug comprise the steps of:

forming a conductive layer over the substrate and filling the contact hole with the conductive layer; and patterning the conductive layer.

13. The method according to claim 1, wherein the step of forming a protective layer on the substrate and the isolation region prevents plasma damage from subsequent processes.

* * * * *